(12) United States Patent  
Adut et al.

(10) Patent No.: US 9,374,050 B1
(45) Date of Patent: Jun. 21, 2016

(54) LEVEL-SHIFTING AMPLIFIER

(71) Applicant: LINEAR TECHNOLOGY CORPORATION, Milpitas, CA (US)

(72) Inventors: Joseph Adut, Palo Alto, CA (US); John Perry Myers, Fremont, CA (US)

(73) Assignee: LINEAR TECHNOLOGY CORPORATION, Milpitas, CA (US)

( * ) Notice: Subject to any disclaimer, the term of this patent is extended or adjusted under 35 U.S.C. 154(b) by 19 days.

(21) Appl. No.: 14/610,597

(22) Filed: Jan. 30, 2015

Related U.S. Application Data

(60) Provisional application No. 62/022,102, filed on Jul. 8, 2014.

(51) Int. Cl.
*H03F 3/45* (2006.01)

(52) U.S. Cl.
CPC ........ *H03F 3/45636* (2013.01); *H03F 3/45488* (2013.01); *H03F 2203/45081* (2013.01); *H03F 2203/45082* (2013.01); *H03F 2203/45116* (2013.01)

(58) Field of Classification Search
CPC ....................................................... H03F 3/45
USPC .......................................... 330/258, 260, 252
See application file for complete search history.

(56) References Cited

U.S. PATENT DOCUMENTS

| | | | |
|---|---|---|---|
| 4,442,400 A | 4/1984 | Nagano | |
| 4,573,021 A | 2/1986 | Widlar | |
| 4,714,896 A | 12/1987 | Addis | |
| 5,181,035 A * | 1/1993 | Mouret | ................. H03M 1/203 341/159 |
| 5,307,024 A | 4/1994 | Metz et al. | |
| 5,392,002 A | 2/1995 | Delano | |
| 5,465,070 A | 11/1995 | Koyama et al. | |
| 5,896,239 A * | 4/1999 | Maki | ...................... G11B 5/012 360/46 |
| 5,963,092 A | 10/1999 | Van Zalinge | |
| 6,118,340 A | 9/2000 | Koen | |
| 6,414,548 B1 | 7/2002 | Weber | |
| 7,202,738 B1 * | 4/2007 | Huijsing | ................. H03F 3/393 330/252 |

(Continued)

*Primary Examiner* — Patricia T Nguyen
(74) *Attorney, Agent, or Firm* — McDermott Will & Emery LLP

(57) ABSTRACT

A differential amplifier may, when connected to a positive or negative supply voltage and to a ground voltage, provide a differential pair of outputs signals at a differential output that are an amplification of a differential pair of input signals at a differential input. A differential input stage may receive the differential pair of input signals from the differential input and may include a first transistor associated with one of the input signals and a second transistor associated with the other input signal. A differential output stage may generate the differential pair of output signals at the differential output and may include a third transistor associated with one of the output signals and a fourth transistor associated with the other output signal. The first, second, third, and fourth transistors may be all P type or all N type. The differential pair of output signals may have a common mode that is: near the ground voltage when the first, second, third, and fourth transistors are all N type and the supply voltage is positive with respect to the ground voltage; near the supply voltage when the first, second, third, and fourth transistors are all P type and the supply voltage is positive with respect to the ground voltage; near the ground voltage when the first, second, third, and fourth transistors are all P type and the supply voltage is negative with respect to the ground voltage; or near the supply voltage when the first, second, third, and fourth transistors are all N type and the supply voltage is negative with respect to the ground voltage.

20 Claims, 5 Drawing Sheets

(56) References Cited

U.S. PATENT DOCUMENTS

2005/0190516 A1* 9/2005 Lee .................... H04L 25/08
361/90

2006/0132179 A1* 6/2006 Kim .................... H04L 5/16
326/82

2014/0003562 A1* 1/2014 Okabe ................ H04B 1/1081
375/347

* cited by examiner

US 9,374,050 B1

LEVEL-SHIFTING AMPLIFIER

CROSS-REFERENCE TO RELATED APPLICATION

This application is based upon and claims priority to U.S. provisional patent application 62/022,102, entitled "Level-Shifting Amplifier," filed Jul. 8, 2014. The entire content of this application is incorporated herein by reference.

BACKGROUND

1. Technical Field

This disclosure relates to level-shifting amplifiers.

2. Description of Related Art

Low-noise broadband linear differential amplifiers may have difficulty operating in class A with an output common mode near a ground supply and at a low voltage, such as 3.3V.

SUMMARY

A differential amplifier may, when connected to a positive or negative supply voltage and to a ground voltage, provide a differential pair of outputs signals at a differential output that are an amplification of a differential pair of input signals at a differential input. A differential input stage may receive the differential pair of input signals from the differential input and may include a first transistor associated with one of the input signals and a second transistor associated with the other input signal. A differential output stage may generate the differential pair of output signals at the differential output and may include a third transistor associated with one of the output signals and a fourth transistor associated with the other output signal. The first, second, third, and fourth transistors may be all P type or all N type. The differential pair of output signals may have a common mode that is: near the ground voltage when the first, second, third, and fourth transistors are all N type and the supply voltage is positive with respect to the ground voltage; near the supply voltage when the first, second, third, and fourth transistors are all P type and the supply voltage is positive with respect to the ground voltage; near the ground voltage when the first, second, third, and fourth transistors are all P type and the supply voltage is negative with respect to the ground voltage; or near the supply voltage when the first, second, third, and fourth transistors are all N type and the supply voltage is negative with respect to the ground voltage.

A differential amplifier may include a first current path and a second current path. Each current path may include a current source; a first transistor and a second transistor, each having a control terminal and a first and a second conduction terminal; a current-mode feedback amplifier; a resistor, wherein the current source, the first and second transistor, and the resistor are connected in series between a supply voltage and a ground voltage, the first and second transistors are connected through their respective first and second conduction terminals, and wherein the common-mode feedback amplifier receives a voltage at the first conduction terminal of the first transistor, and provides an output signal to drive the control terminal of the second transistor; and a resistor connected between the second conduction terminal of the first transistor of the first current path and the second conduction terminal of the first transistor of the second current path.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF ILLUSTRATIVE EMBODIMENTS

Illustrative embodiments are now described. Other embodiments may be used in addition or instead. Details that may be apparent or unnecessary may be omitted to save space or for a more effective presentation. Some embodiments may be practiced with additional components or steps and/or without all of the components or steps that are described.

Broadband linear amplifiers may rely on voltage-mode or current-mode feedback to linearize a differential pair.

Figure 1:
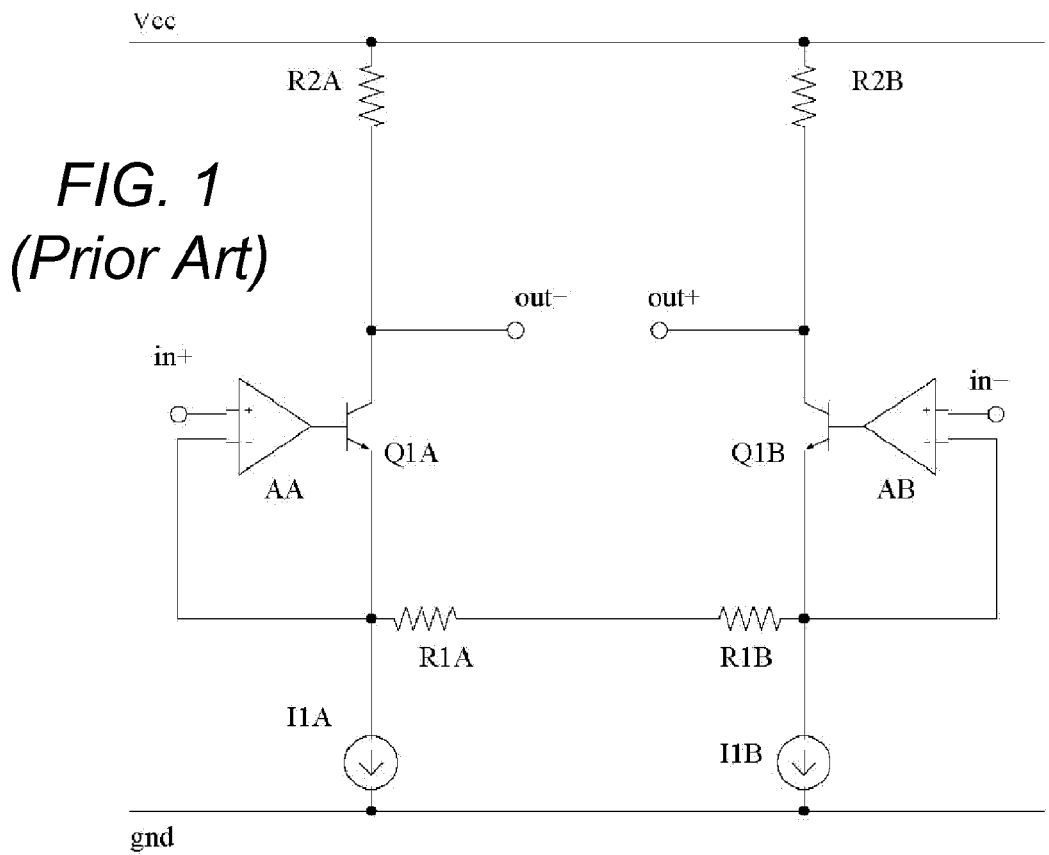
FIG. 1 illustrates an example of a prior art broadband linear amplifier with unity gain buffers that uses voltage-mode feedback to linearize its differential pair.

FIG. 1 illustrates an example of a prior art broadband linear amplifier with unity gain buffers that uses voltage-mode feedback to linearize its differential pair. Unity-gain buffer amplifiers that use voltage-mode feedback may provide very accurate replication of high-frequency differential signals. They may provide an inverting gain of R2/R1 with excellent linearity, especially at low frequencies.

Voltage-mode feedback circuits may provide excellent linearity because of their high gain at low frequencies. The circuit may also include amplifiers AA and AB, transistors Q1A and Q1B, resistors R1A, R1B, R2A, and R2B, and current sources I1A and I1B, connected as illustrated in FIG. 1. More details about such an amplifier may be found, for example, in U.S. Pat. No. 4,714,896.

Figure 2:
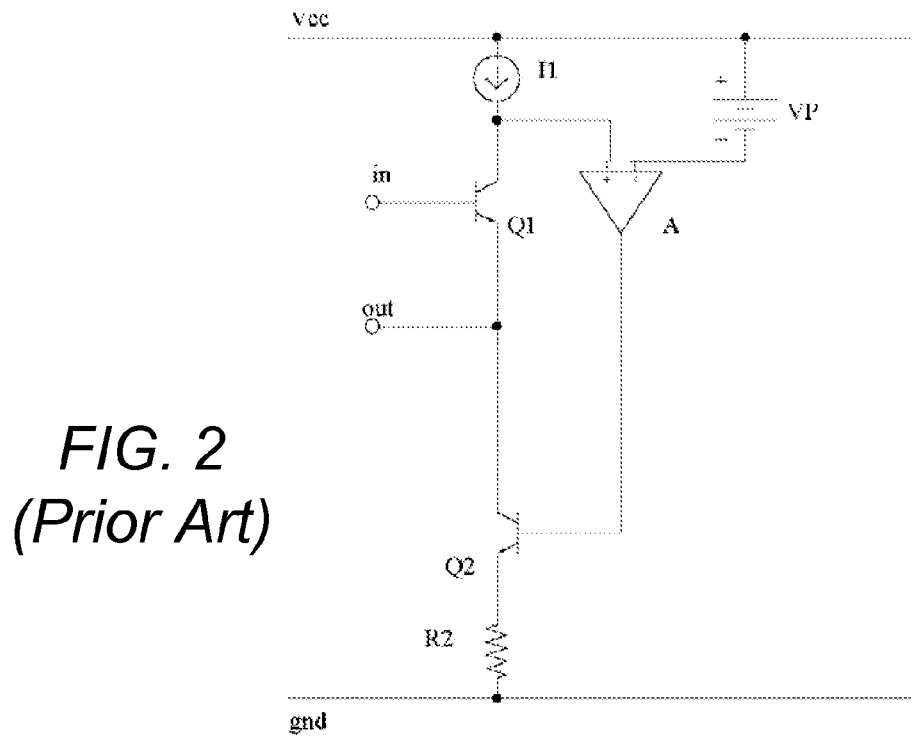
FIG. 2 illustrates an example of a prior art, output stage for a power amplifier that uses current-mode feedback to linearize an emitter follower.

FIG. 2 illustrates an example of a prior art, output stage for a power amplifier that uses current-mode feedback to linearize an emitter follower. Circuits that use current-mode feedback may be able to sustain very good linearity over a wider bandwidth because their impedance levels may be lower compared to voltage-mode feedback circuits. This property can make current-mode feedback more attractive for broadband linear amplifiers. The circuit may also include amplifier A, transistor Q1 and Q2, resistor R2, a reference voltage VP, and current source I1, connected as illustrated in FIG. 2. More details about such an amplifier may be found, for example, in U.S. Pat. No. 4,573,021.

In FIG. 2, the collector current of the transistor Q1 may be held constant by a feedback loop that compensates for changes in load current by dynamically adjusting the collector current of the transistor Q2 by changing the amplifier A's output that drives the base of the transistor Q2. A resistor R2 may be used to stabilize the feedback loop formed by the transistors Q1 and Q2 and amplifier A. Amplifier A can have two differential inputs and a single output, with one of the input terminals connected to the reference voltage VP. Amplifier A may instead have a single input and single output.

Figure 3:
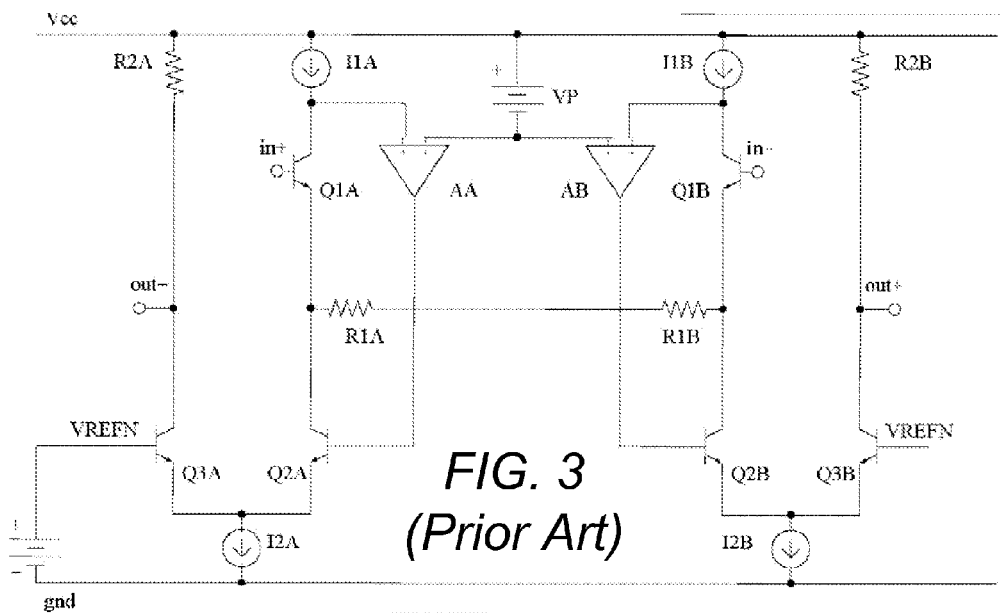
FIG. 3 illustrates an example of a prior art broadband linear amplifier that uses two instances of the linearized emitter-follower with current-mode feedback illustrated in FIG. 2 in a differential gain stage formed by symmetrical halves A and B.

FIG. 3 illustrates an example of a prior art, broadband linear amplifier that uses two instances of the linearized emitter-follower with current-mode feedback illustrated in FIG. 2 in a differential gain stage formed by symmetrical halves A and B. A transistor Q1A may be linearized by an amplifier AA and a transistor Q2A. Similarly, a transistor Q1B may be linearized by an amplifier AB and a transistor Q2B. A linear copy of the voltage change at the inputs of the differential pair—at the bases of the transistors Q1A and Q1B—may be reproduced at the emitters of the same transistors, impressing a current change across resistors R1A and R1B. The differential current may first be folded by differential transistor pairs Q2A, Q3A and Q2B, Q3B, and then delivered to load resistors R2A and R2B. In this manner, an inverting voltage gain of R2/R1 may be developed between the outputs and inputs. The circuit may also include one voltage source VP, and current sources I1A, I1B, I2A, and I2B, as illustrated in FIG. 3. More details about such an amplifier may be found, for example, in U.S. Pat. No. 5,307,024.

For a linear and low noise circuit, the quiescent currents in both sides of the differential pair may be matched, e.g., IC(Q2A)=IC(Q3A) and IC(Q2B)=IC(Q3B). Therefore, a significant portion of the current budget may be used in folding the differential current to the load.

For best linearity, the current sources I1A, I1B, I2A, and I2B may be implemented with bipolar transistors, not MOSFETs. However, this four transistor stack may make this circuit unsuitable for low-voltage (e.g., 3.3 V) applications.

Figure 4:
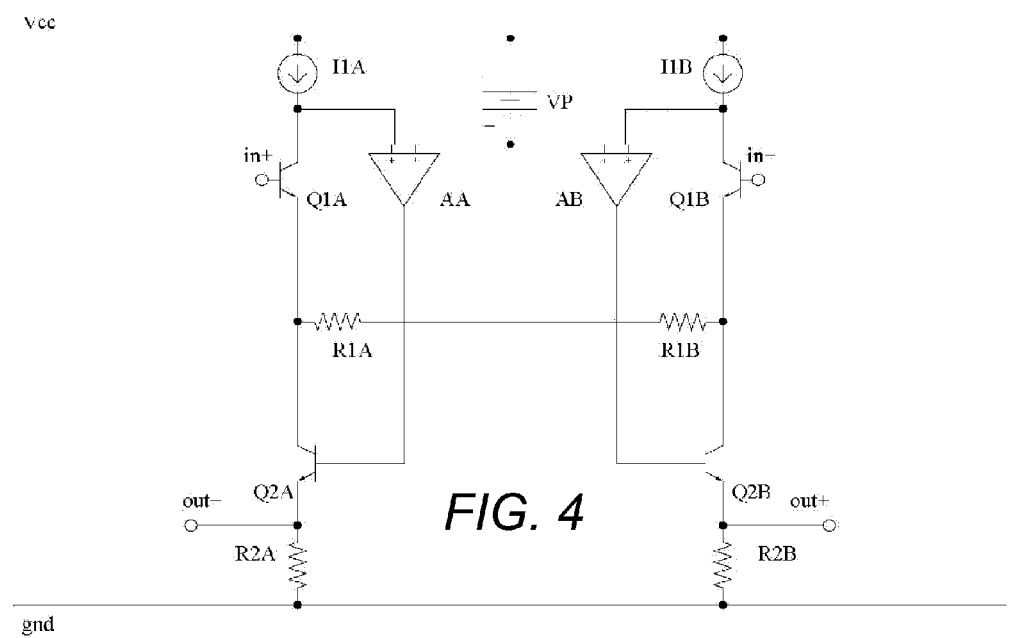
FIG. 4 illustrates an example of a level-shifting differential amplifier that may provide an output common mode near ground, consume less current than previous solutions, and operate at a single supply voltage as low as 3.3 V.

FIG. 4 illustrates an example of a level-shifting differential amplifier that may provide an output common mode near ground, consume less current than previous solutions, and operate at a single supply voltage as low as 3.3 V. This may be achieved by causing resistors R2A and R2B that are stabilizing transistors Q2A and Q2B, respectively, in an output stage of FIG. 2 to also define the gain of the differential amplifier. By coupling two instances of the linearized emitter follower in FIG. 2 at the emitters of transistors Q1A and Q1B with gain-setting resistors R1A and R1B, respectively, and then taking the output at the emitters of Q2A and Q2B, a more efficient and compact form of the amplifier in FIG. 3 with an output common mode near ground can be built.

Viewed from a different perspective, the circuit of FIG. 4 can be realized by removing transistors Q3A and Q3B and current sources I2A and I2B from FIG. 3, and moving resistors R2A and R2B between the emitters of the transistors Q2A and Q2B and ground. This may result in a more compact level-shifting amplifier that consumes less current. The outputs may then be taken at the emitters of the transistors Q2A and Q2B.

Since only two transistors, a current source, and a load resistor are stacked at each side in FIG. 4, operation at lower power supply voltage, e.g. 3.3V, may be possible. This circuit may achieve the same linearity at lower noise and over a wider bandwidth as compared to the one in U.S. Pat. No. 5,307,024, and may provide the same functionality with fewer elements. Also, this circuit's output common mode may be near ground, instead of near the positive supply. This may make it attractive for driving circuits with low input common mode below 1 V, e.g., fast and linear pipe-lined ADCs built with fine-line CMOS technologies. This may be in contrast to a typical NPN differential pair that may have an output common mode near the positive supply of this amplifier. The circuit in FIG. 4 may also use an NPN differential pair input stage, while still providing an output common mode near ground. The circuit in FIG. 4 may also have amplifiers AA and AB, a voltage reference VP, and current sources I1A and I1B.

Figure 5:
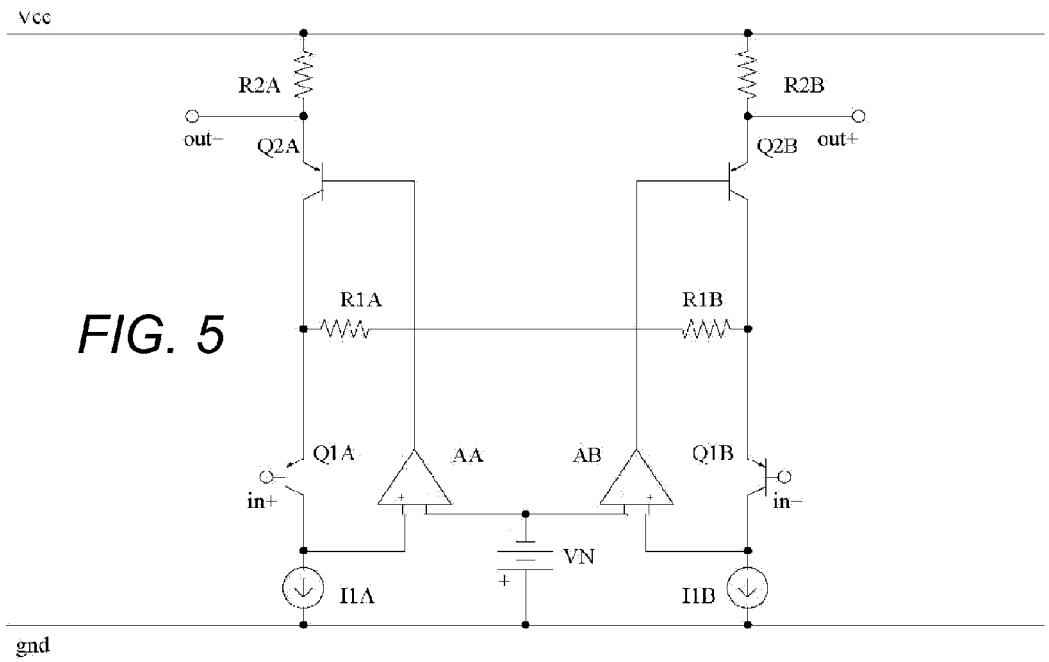
FIG. 5 illustrates an example of a level-shifting differential amplifier of the type illustrated in FIG. 4, except using PNP transistors, with an output common mode near the supply.

FIG. 5 illustrates an example of a level-shifting differential amplifier of the type illustrated in FIG. 4, except using PNP transistors Q1A, Q1B, Q2A, and Q2B, with an output common mode near the supply. A typical PNP differential pair has an output common mode near ground. The amplifier illustrated in FIG. 5, on the other hand, also uses a PNP differential pair input stage, but provides an output common mode near the supply. The circuit in FIG. 5 may also have amplifiers AA and AB, a voltage reference VN, current sources I1A and I1B, and resistors R1A, R1B, R2A, and R2B, connected as illustrated in FIG. 5.

The differential amplifier of FIG. 4 with an output common mode near ground has only NPN transistors in the signal path. Therefore, it may have much better linearity as compared to a typical PNP differential pair. The nominal value of the constant current sources I1A and I1B in FIG. 4 can be varied to adjust the output common-mode level.

Figure 6:
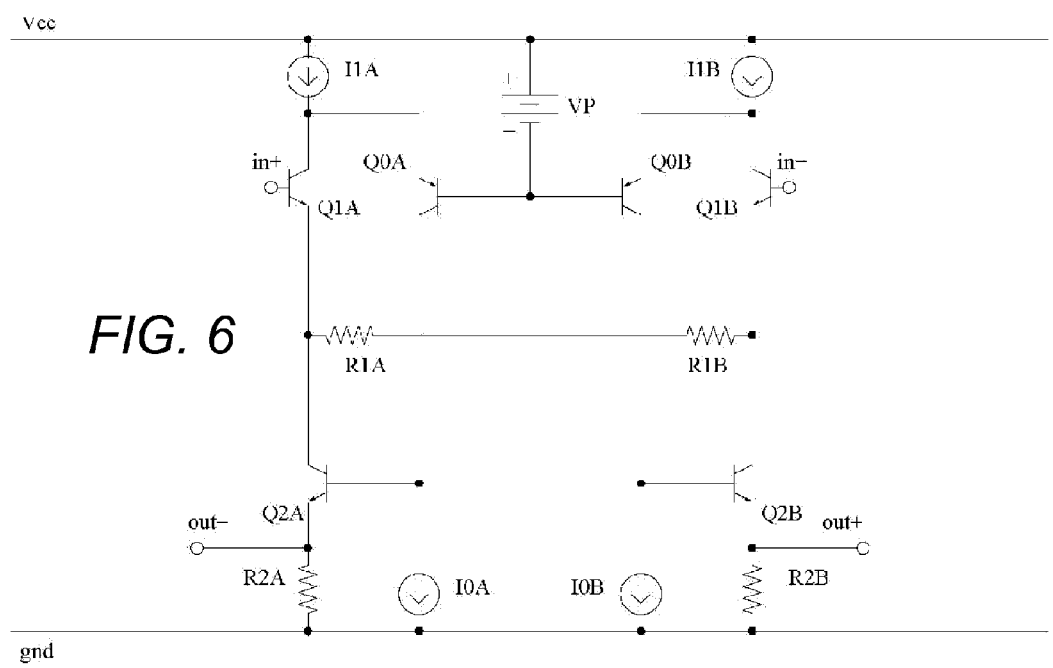
FIG. 6 illustrates an example of a level shifting differential amplifier that implements amplifiers in FIG. 4 with common-base PNP transistors and current sources.

FIG. 6 illustrates an example of a level shifting differential amplifier that implements amplifiers AA and AB in FIG. 4 with common-base PNP transistors Q0A and Q0B and current sources I0A and I0B. The circuit in FIG. 6 may also have a voltage reference VP, current sources I1A and I1B, resistors R1A, R1B, R2A, and R2B, and transistors Q1A, Q1B, Q2A, and Q2B, connected as illustrated in FIG. 6.

Figure 7:
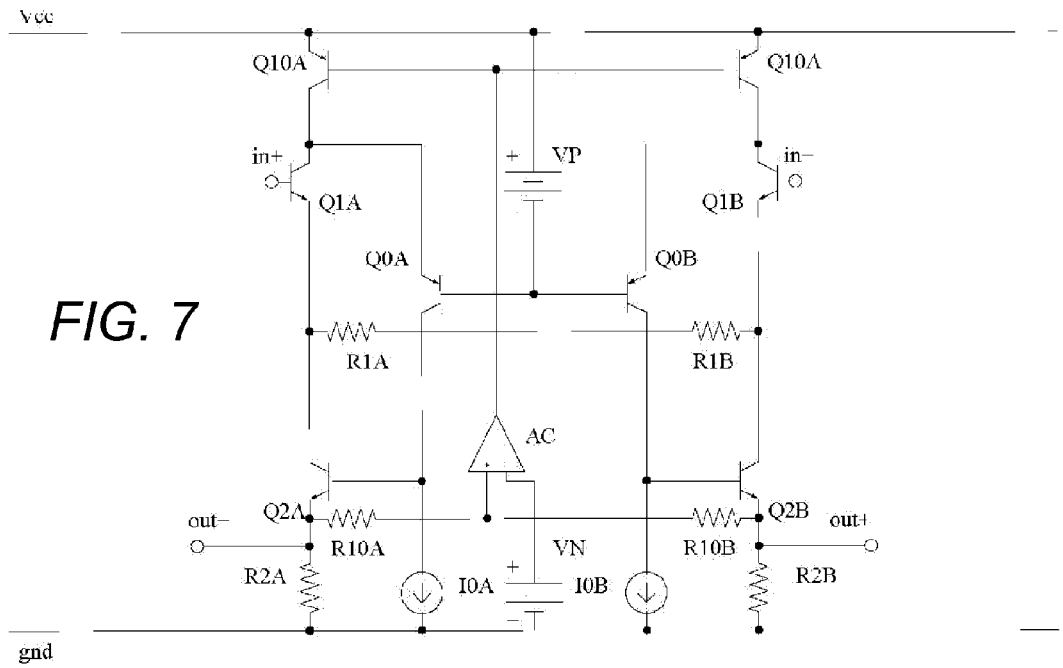
FIG. 7 illustrates an example of a level-shifting differential amplifier that uses an amplifier AC to set the output common mode to a fixed voltage VN by adjusting current sources dynamically.

FIG. 7 illustrates an example of a level shifting differential amplifier that uses an amplifier AC to set the output common mode to a fixed voltage VN by adjusting currents source transistors Q10A and Q10B dynamically. The circuit in FIG. 7 may also have a voltage reference VP, resistors R1A, R1B, R2A, R2B, R10A, R10B, and transistors Q0A, Q0B, Q1A, Q1B, Q2A, Q2B, Q10A, and Q10B, connected as illustrated in FIG. 7.

Figure 8:
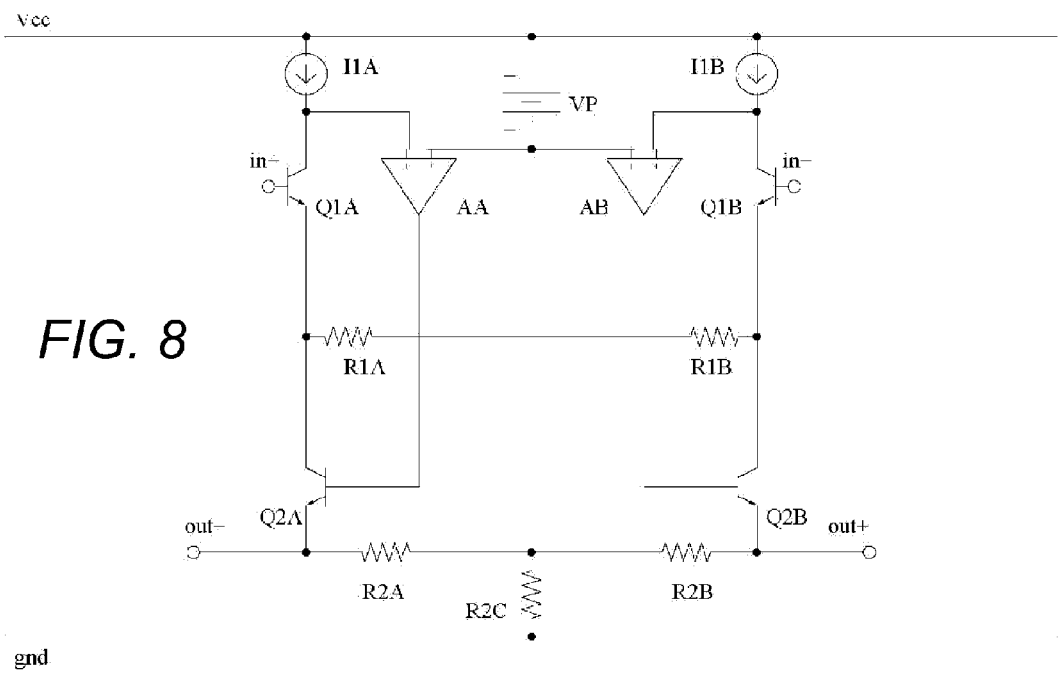
FIG. 8 illustrates an example of a level-shifting differential amplifier that can change the output common mode without changing the quiescent current.

FIG. 8 illustrates an example of a level shifting differential amplifier that can change the output common mode without changing the quiescent current. A common-mode resistor R2C may be used to facilitate this functionality. The circuit in FIG. 8 may also have a voltage reference VP, resistors R1A, R1B, R2A, R2B, current sources I1A and I1B, amplifiers AA and AB, and transistors Q1A, Q1B, Q2A, and Q2B, connected as illustrated in FIG. 8.

Figure 9:
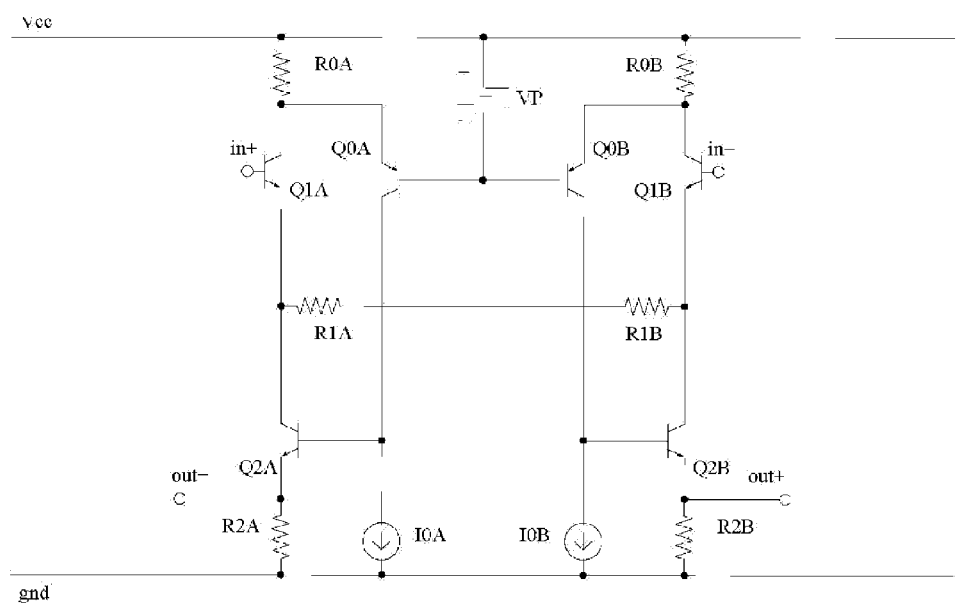
FIG. 9 illustrates an example of a level-shifting differential amplifier that uses resistors in place of current sources for better noise performance, lowest power supply voltage, and/or widest input common-mode range.

FIG. 9 illustrates an example of a level shifting differential amplifier that uses resistors R0A and R0B in place of current sources I1A and I1B, respectively, for better noise performance, lowest power supply voltage, and/or widest common-mode input range. The circuit in FIG. 9 may also have a voltage reference VP, resistors R1A, R1B, R2A, R2B, transistors Q0A, Q0B, Q1A, Q1B, Q2A, and Q2B, and current sources I0A and I0B, connected as illustrated in FIG. 9.

Various low-noise, linear, broadband amplifiers supporting output common-mode voltages near ground or supply and relying on current-mode feedback have now been disclosed. These may operate at lower current and/or at lower power supply voltage, yet may have lower output noise. The amplifiers may be used as a level-shifter.

The components, steps, features, objects, benefits, and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits, and/or advantages. These also include embodiments in which the components and/or steps are arranged and/or ordered differently.

For example, MOSFETS could be used instead of the BJT transistors that have been illustrated.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element preceded by an "a" or an "an" does not, without further constraints, preclude the existence of additional elements of the identical type.

None of the claims are intended to embrace subject matter that fails to satisfy the requirement of Sections 101, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

The invention claimed is:

1. A differential amplifier that, when connected to a positive or negative supply voltage and to a ground voltage, provides a differential pair of outputs signals at a differential output that are an amplification of a differential pair of input signals at a differential input, comprising:
   a differential input stage that receives the differential pair of input signals from the differential input and that includes a first transistor associated with one of the input signals and a second transistor associated with the other input signal; and
   a differential output stage that generates the differential pair of output signals at the differential output and that includes a third transistor associated with one of the output signals and a fourth transistor associated with the other output signal,
   wherein the first, second, third, and fourth transistors are all P type or all N type, and
   wherein the differential pair of output signals has a common mode that is:
      near the ground voltage when the first, second, third, and fourth transistors are all N type and the supply voltage is positive with respect to the ground voltage;
      near the supply voltage when the first, second, third, and fourth transistors are all P type and the supply voltage is positive with respect to the ground voltage;
      near the ground voltage when the first, second, third, and fourth transistors are all P type and the supply voltage is negative with respect to the ground voltage; or
      near the supply voltage when the first, second, third, and fourth transistors are all N type and the supply voltage is negative with respect to the ground voltage.

2. The differential amplifier of claim 1 wherein the third and fourth transistors each have a conduction terminal and each differential output is connected directly to a different one of the conduction terminals.

3. The differential amplifier of claim 1 wherein the first and second transistors each have a conduction terminal and the differential input stage includes a conversion resistance between the conduction terminals of the first and second transistors.

4. The differential amplifier of claim 1 wherein the first and second transistors each have a conduction terminal and the third and fourth transistors each have a control input and further comprising:

a first amplifier with an input connected to the conduction terminal of the first transistor and an output connected to the control input of the third transistor; and a second amplifier with an input connected to the conduction terminal of the second transistor and an output connected to the control input of the fourth transistor.

5. The differential amplifier of claim 1 wherein the third and fourth transistors each have a conduction terminal and further comprising:

a first resistance connected in series between the conduction terminal of the third transistor and the supply or ground voltage; and a second resistance connected in series between the conduction terminal of the fourth transistor and the supply or ground voltage.

6. The differential amplifier of claim 1 wherein the first and the second transistors each have a conduction terminal and further comprising:

a first current source connected in series between the conduction terminal of the first transistor and the supply or ground voltage; and a second current source connected in series between the conduction terminal of the second transistor and the supply or ground voltage.

7. The differential amplifier of claim 6 where the first and the second current sources are constant current sources.

8. The differential amplifier of claim 1 wherein the first and the second current sources are resistances.

9. The differential amplifier of claim 1 wherein the transistors are BJTs.

10. The differential amplifier of claim 1 wherein the transistors are MOSFETs.

11. A differential amplifier, comprising:

a first current path and a second current path, each current path comprising:

a current source;

a first transistor and a second transistor, each having a control terminal and a first and a second conduction terminal;

a current-mode feedback amplifier; and a resistor, wherein the current source, the first and second transistor, and the resistor are connected in series between a supply voltage and a ground voltage, the first and second transistors are connected through their respective first and second conduction terminals, and wherein the current-mode feedback amplifier receives a voltage at the first conduction terminal of the first transistor, and provides an output signal to drive the control terminal of the second transistor; and a resistor connected between the second conduction terminal of the first transistor of the first current path and the second conduction terminal of the first transistor of the second current path.

12. The differential amplifier of claim 11, wherein the first and second conduction terminals of each transistor constitute a collector and emitter of the transistor, respectively, and wherein the control terminal of each transistor is a base of the transistor.

13. The differential amplifier of claim 11, wherein the first and second conduction terminals of each transistor constitute a drain and source of the transistor, respectively, and wherein the control terminal of each transistor is a gate of the transistor.

14. The differential amplifier of claim 11, wherein a differential input signal is provided across the first control terminal of the first transistor in the first current path and the first control terminal of the first transistor of the second current path and a differential output signal is taken from a voltage difference across the second conduction terminal of the second transistor of the first current path and the second conduction terminal of the second transistor of the second current path.

15. The differential amplifier of claim 11, wherein the current-mode feedback amplifier in each current path comprises a third transistor and a current source connected in series between the first conduction terminal of the first transistor and the ground voltage, and wherein the second conduction terminal of the third transistor is connected to the first conduction terminal of the first transistor and the first conduction terminal of the third transistor is connected to the control terminal of the second terminal.

16. The differential amplifier of claim 11, further comprising a common-mode amplifier configured to dynamically adjust the current source of each current path.

17. The differential amplifier of claim 16, wherein the common-mode amplifier has as inputs a reference voltage and the common-mode voltage of the differential amplifier outputs.

18. The differential amplifier of claim 16, wherein each current source of each current path comprises a transistor.

19. The differential amplifier of claim 11, wherein each current source of each current path comprises a resistor.

20. The differential amplifier of claim 11, further comprising a common-mode resistor, wherein the common-mode resistor is included as a common part of both the resistor in the first current path and the resistor in the second current path.

* * * * *